United States Patent
Son et al.

(10) Patent No.: US 7,026,242 B2
(45) Date of Patent: Apr. 11, 2006

(54) METHOD FOR FILLING A HOLE WITH A METAL

(75) Inventors: Hong-Seong Son, Gyeonggi-do (KR); Sang-Rok Hah, Seoul (KR); Il-Goo Kim, Gyeonggi-do (KR); Jun-Hwan Oh, Incheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 74 days.

(21) Appl. No.: 10/802,411

(22) Filed: Mar. 16, 2004

(65) Prior Publication Data

US 2004/0253813 A1  Dec. 16, 2004

(30) Foreign Application Priority Data

Mar. 17, 2003  (KR) .................... 10-2003-0016433

(51) Int. Cl.
*H01L 21/4763* (2006.01)

(52) U.S. Cl. ..................................... 438/638

(58) Field of Classification Search ................ 438/638
See application file for complete search history.

(56) References Cited

U.S. PATENT DOCUMENTS 5,712,185 A * 1/1998 Tsai et al. .................. 438/424
6,010,962 A * 1/2000 Liu et al. .................... 438/687
6,121,149 A * 9/2000 Lukanc et al. .............. 438/692
6,402,923 B1 * 6/2002 Mayer et al. ................. 205/96

FOREIGN PATENT DOCUMENTS

KR   2002-88399   11/2002

OTHER PUBLICATIONS

English language abstract of Korean Publication No. 2002-88399.

* cited by examiner

*Primary Examiner*—Asok Kumar Sarkar
(74) *Attorney, Agent, or Firm*—Marger Johnson & McCollom, P.C.

(57) ABSTRACT

In a method for filling a hole with a metal, an insulating layer, a first mask layer and a second mask layer are successively formed on a semiconductor substrate. The first and second mask layers are etched using a photoresist pattern to form first and second masks. The first mask layer pattern is selectively etched using an etchant, the first mask layer pattern having a higher etching selectivity than the second layer pattern with respect to the etchant, to form a third mask layer pattern having a broadened opening. The insulating layer is etched using the second mask to form a hole in the insulating layer. A metal layer is formed in the hole and the third opening. The metal layer is planarized to form a metal plug buried in the hole without recesses or voids.

22 Claims, 11 Drawing Sheets

METHOD FOR FILLING A HOLE WITH A METAL

CROSS REFERENCE TO RELATED APPLICATIONS

This application claims priority under 35 USC §119 to Korean Patent Application 2003-16433, filed on Mar. 17, 2003, the contents of which are herein incorporated by reference in their entirety for all purposes.

BACKGROUND OF THE INVENTION

1. Field of the Invention

The present invention relates to a method for filling a hole with a metal. More particularly, the present invention relates to a method for filling a hole with a metal to form a metal plug in a contact hole or a via hole without a void or a recess therein.

2. Description of the Related Art

Generally, the memory capacity of a random access memory (RAM) chip is represented according to Moore's principle, which states that the memory capacity of a RAM chip increases about four times every three years. Whenever a new chip appears, the increase in capacity is achieved by reducing the chip size and lengthening of chip length. As the chip size is reduced, the distance between interconnect lines is shortened. However, the interconnect lines have an effect on each other. As a result, when the distance between the interconnect lines is below a predetermined value, a signal delay will occur in the semiconductor chip. To improve the signal processing speed of the semiconductor chip, a reduction to the specific resistance of a metal used as the interconnect line is required.

Traditionally, aluminum or aluminum alloy having the specific resistance of about 2.66 $\mu\Omega$/cm has been used as the interconnect line. The IBM Corporation discloses a method for forming a metal wiring using copper having the specific resistance of about 1.65 $\mu\Omega$/cm in 1988. The method for forming a metal wiring using copper has been studied. However, since copper is rapidly diffused in a silicon layer or most metal layers, a photolithography process may not be employed when forming a copper wiring. Accordingly, a damascene process is typically employed when forming a copper wiring.

Recently, copper has been widely used as the wiring in semiconductor devices. However, when the final wiring includes copper, an aluminum pad must be additionally used in the packaging process. To the contrary, when the final wiring includes aluminum, the aluminum pad is not used in the packaging process. Accordingly, the final wiring typically includes aluminum due to convenience and reduced cost. When the final wiring includes aluminum, copper is formed in a contact hole or a via hole and is connected to a lower conductive layer. Copper electrically connected between the lower conductive layer and an upper aluminum layer is formed through a single damascene process.

Figure 1:
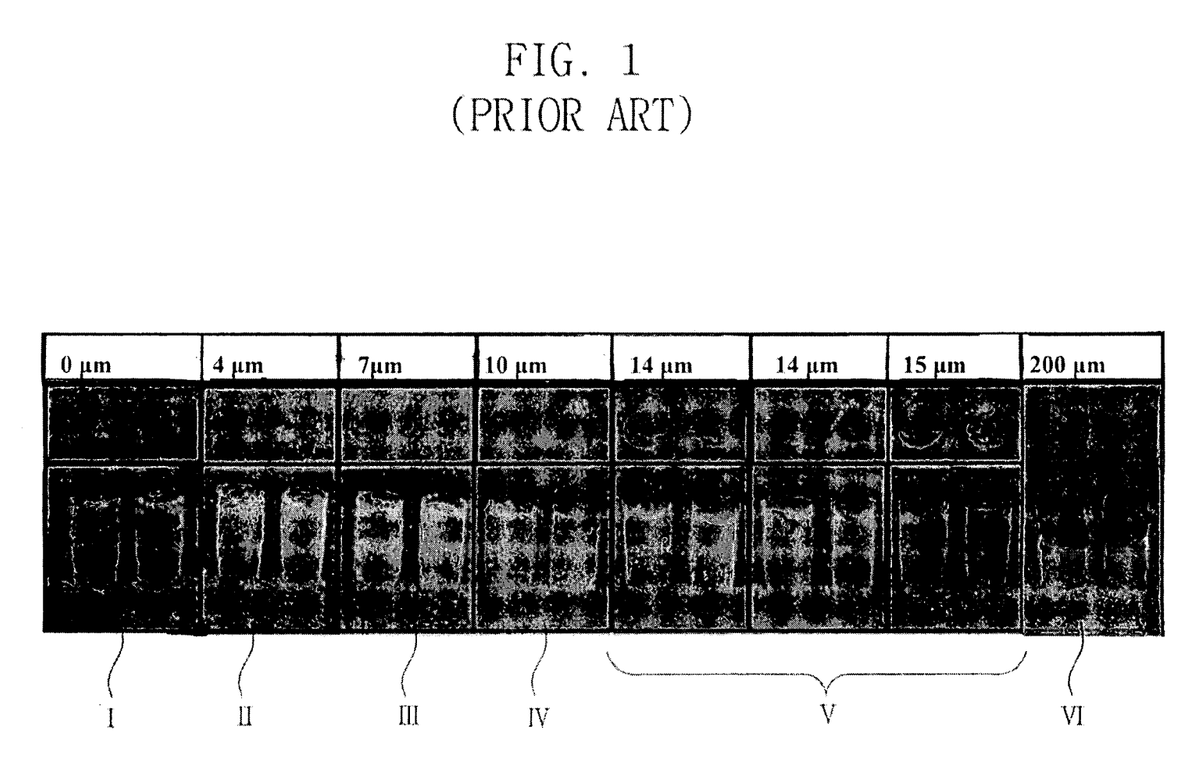
FIG. 1 is a scanning electron microscope (SEM) photograph illustrating copper buried in a via hole according to a conventional single damascene process.
Figure 2:
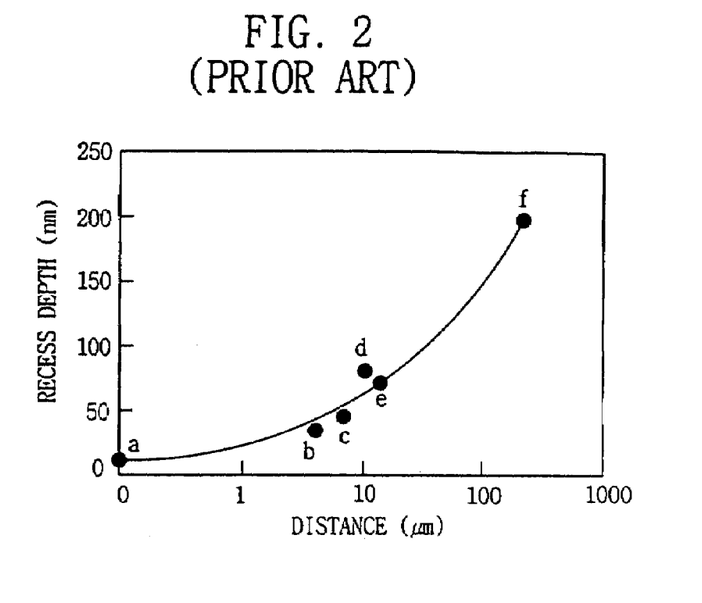
FIG. 2 is a graph illustrating recess depths of a copper layer according to distance apart from a dense pattern for forming a via hole.

FIG. 1 is a scanning electron microscope (SEM) photograph illustrating a via hole filled with copper through a single damascene process, and FIG. 2 is a graph illustrating the recess depth of copper versus the distance apart from a dense pattern for forming a via hole.

Referring to FIGS. 1 and 2, the recess depth of a copper layer is dependent on the distance apart from a dense pattern for forming a via hole. The recess depth of the copper layer is augmented proportional to the distance apart from the pattern for forming the via hole. The recess of the copper layer in the via hole is caused by electrical failure between the copper layer and a wiring. As the via hole moves further apart from the dense pattern, the electrical failure becomes more severe.

In FIG. 1, a via hole I is positioned in the dense pattern, a via hole II is apart from the dense pattern at a distance of about 4 $\mu$m, a via hole III is apart from the dense pattern at a distance of about 7 $\mu$m, a via hole IV is apart from the dense pattern at a distance of about 10 $\mu$m, a via hole V is apart from the dense pattern at a distance of about 14 $\mu$m to about 15 $\mu$m, and a via hole VI is apart from the dense pattern at a distance of about 220 $\mu$m. The recess of copper layer is about 0 $\mu$m in the via hole I. The recess depth of the copper layer is increased according to the distance apart from the dense pattern in the via holes II and III, respectively. Furthermore, the recess depth of the copper layer is remarkably increased when the distance apart from the dense pattern is greater or equal to about 10 $\mu$m as in the via holes IV, V and VI.

Figure 3:
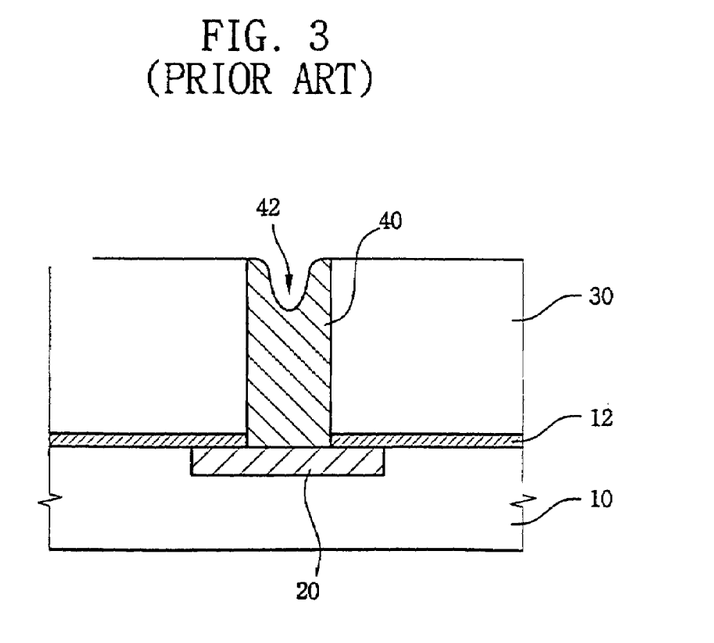
FIG. 3 is a cross-sectional view illustrating a method for filling a hole with copper according to a conventional single damascene process.
Figure 4:
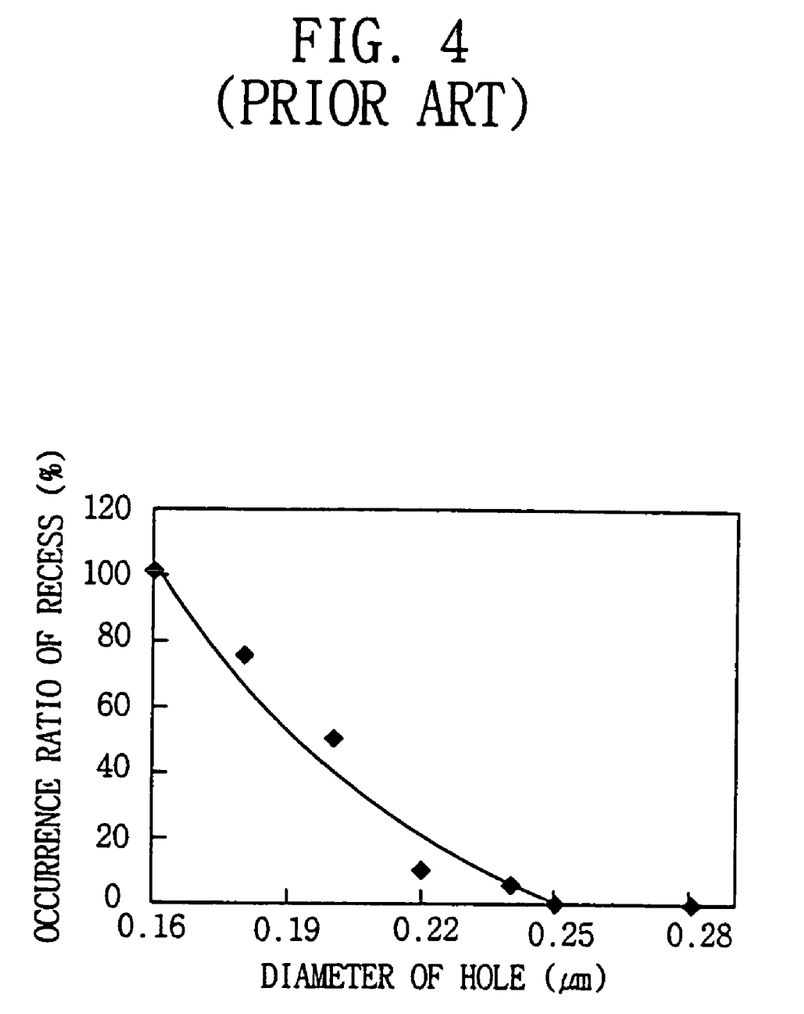
FIG. 4 is a graph illustrating the occurrence ratio of voids according to sizes of via holes.

FIG. 3 is a cross-sectional view illustrating a conventional method for filling a via hole with a copper layer through a single damascene process, and FIG. 4 is a graph illustrating occurrence ratio of a void or a recess in a copper layer according to sizes of via holes.

Referring to FIG. 3, a via hole or a contact hole is formed through an etching stop layer 12 and an insulating layer 30 formed on a semiconductor substrate 10 to expose a lower conductive layer 20 formed on the semiconductor substrate 10. A metal plug 40 is formed in the via hole or the contact hole. A void or a recess is formed on an upper surface of the metal plug 40. The void or the recess has a shape partially recessed on the upper surface of the metal plug 40.

In a process for forming the metal plug 40, the insulating layer 30, and the etching stop layer 12 are etched using a photoresist pattern (not shown) to form a via hole. A copper layer is formed in the via hole through a chemical vapor deposition (CVD) process or an electroplating process. The copper layer grows on a bottom face and a side face of the via hole, and an upper face of the insulating layer 30 in the electroplating process. The copper layer rapidly grows at an inlet of the via hole having a short diameter so that a cavity is formed in the copper layer. The cavity is exposed through a chemical mechanical polishing (CMP) process to form the void or the recess 42 on the metal plug 40.

The recess 42 formed in the metal plug 40 may be a potential cause for the electrical failure between the metal plug 40 and a wiring (not shown). An electrolyte remaining in the recess 42 may be evaporated and expanded during a successive annealing process. A gas expanded by high temperature may weaken bonding strength between the metal plug 40 and the upper wiring, and may peel off the upper wiring.

Referring to FIG. 4, in the conventional single damascene process, the void or the recess frequently occurs when the metal plug 40 is formed in the via hole having a diameter of below about 0.25 $\mu$m. The void or the recess may not occur when the metal plug 40 is formed in the via hole having a diameter of above about 0.25 $\mu$m. As described above, the occurrence ratio of the void or recess in the metal plug increases proportional to reducing the size of the via hole. Accordingly, when the copper metal, for example, is formed in the minute hole through the conventional single damascene process, a void or recess is frequently formed in the metal.

Embodiments of the invention address these and other disadvantages of the conventional art.

SUMMARY OF THE INVENTION

Embodiments of the invention provide a method for filling a hole with a metal, which may form a metal plug in a via hole or a contact hole through complete gap filling without a recess and a void in the metal plug.

In accordance with some embodiments of the invention, an insulating layer, a first mask layer and a second mask layer are successively formed on a semiconductor substrate. The first and second mask layers are etched to form first and second masks having first openings that have first widths, respectively. The first mask is selectively etched to form a third mask having a second opening that has a second width that is greater than the first width. The insulating layer is etched using the second mask to form an insulating layer pattern having a hole that has the first width. A metal layer is formed in the hole and the second opening. The third mask and the metal layer are removed through a CMP process or an etch-back process to form a metal plug buried in the hole of the insulating layer pattern.

To form the second opening, the first mask may be selectively etched using an etchant, for example, such as a HF solution. The first mask has a higher etching selectivity with respect to the HF solution than the second mask.

The second opening has a width longer than the diameter of the hole and is formed at an inlet of the hole so that the overall diameter of the hole is increased. Also, the hole is deeply formed by the masks having the openings. The recess is removed through the CMP process so that a metal plug is formed in the hole. Furthermore, the gap filling qualities of the copper layer is improved by the stepped structure formed by the hole and the openings.

In accordance with other embodiments of the invention, an insulating layer and a first mask layer are successively formed on a semiconductor substrate. The first mask layer is etched to form a first mask having a first opening that has a first width. The insulating layer is etched using the first mask as a mask to form an insulating layer pattern having a hole that has the first width. The first mask is etched to form a second mask having a second opening that has a second width that is greater than the first width. A metal layer is formed in the hole and the second opening. The second mask and the metal layer are removed to form a metal plug disposed in the hole of the insulating layer pattern.

In accordance with still other embodiments of the invention, a first mask layer and a second mask layer are successively formed on a semiconductor substrate. A photoresist pattern is formed on the second mask layer. The first and second mask layers are etched using the photoresist pattern as a mask to form a first mask having a first opening that has a first width and a second mask having a second opening that is greater than the first width. The first mask is selectively etched using an etchant, the first mask having a higher etching selectivity with respect to the etchant than the second mask, to form a third mask having a third opening that has a second width that is greater than the first width. The insulating layer is dry etched using the second mask to form an insulating layer pattern having a hole that has the first width. A metal layer is disposd in the hole and in the third opening. The third mask and the metal layer are removed to expose an upper surface of the insulating layer by a CMP process or an etch-back process, forming a metal plug buried in the hole of the insulating layer pattern.

In accordance with some more embodiments of the invention, an insulating layer and a mask layer are successively formed on a semiconductor substrate. A first photoresist pattern is formed on the mask layer. The insulating layer and the mask layer are etched using the photoresist pattern as a mask to form an insulating pattern having a hole that has a first width, and a mask having a first opening that has the first width. A second photoresist pattern having a pattern width longer than the first width is formed on the mask. The mask is etched using the second photoresist pattern as a mask to expose an upper surface of the insulating layer pattern and to form a second opening having a second width that is greater than the first width. A metal layer is formed in the hole and in the second opening. The mask and the metal layer are removed to expose the upper surface of the insulating layer with a CMP process or an etch-back process and to form a metal plug buried in the hole of the insulating layer pattern.

BRIEF DESCRIPTION OF THE DRAWINGS

The above and other features and advantages of the invention will become readily apparent by reference to the following detailed description when considered in conjunction with the accompanying drawings.

DESCRIPTION OF THE PREFERRED EMBODIMENTS

Hereinafter, a method for filling a hole with a metal according to embodiments of the invention is described in detail.

FIGS. 5A to 5H are cross-sectional views illustrating a method for filling a hole with a metal according to some embodiments of the invention. FIG. 6 is a cross-sectional view illustrating characteristics of electroplating process according to some other embodiments of the invention.

In one embodiment, processes for forming a metal plug in a contact hole or a via hole formed in an insulating layer will be described. In FIG. 5A to 5H, conductive structures such as transistors, capacitors, and wirings are not shown in order not to unduly obscure the embodiments.

Figure 5A:
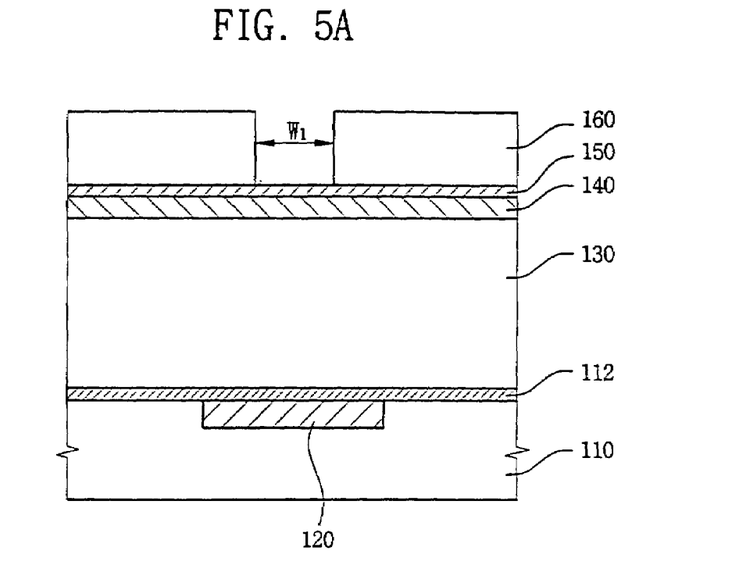
FIGS. 5A to 5H are cross-sectional views illustrating a method for filling a hole with a metal according to some embodiments of the invention.
Figure 6:
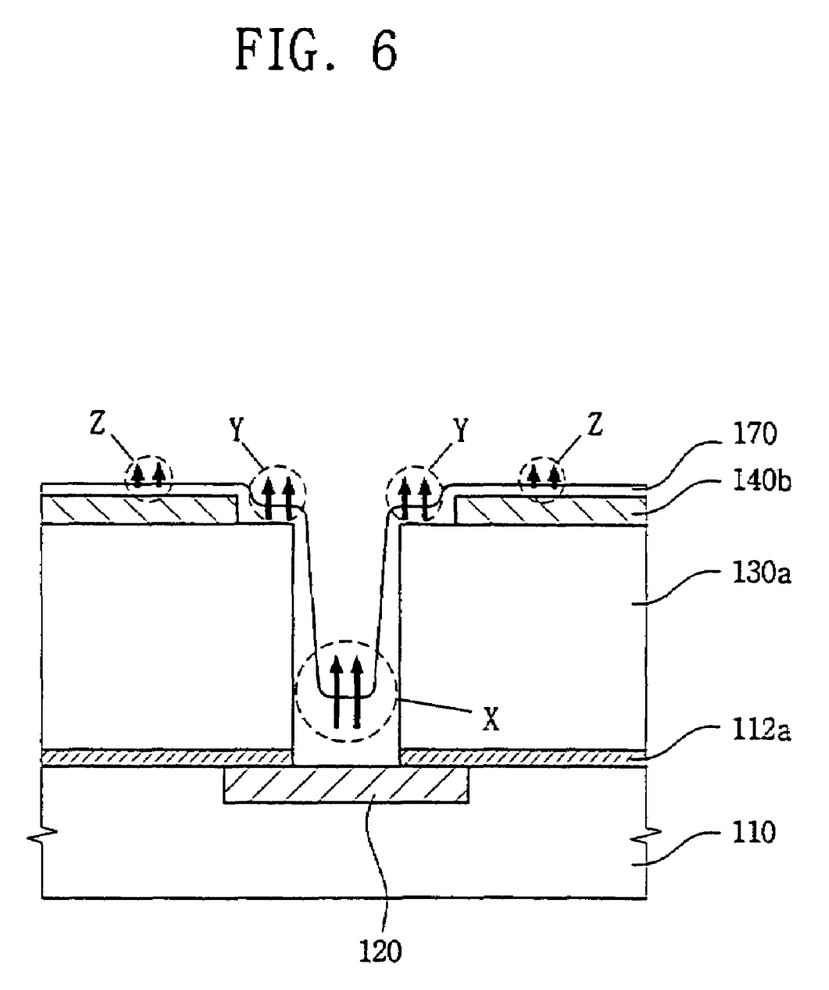
FIG. 6 is a cross-sectional view illustrating characteristics of the electroplating process according to some other embodiments of the invention.

Referring to FIG. 5A, a lower conductive layer 120 corresponding to source/drain regions, a word line, or a bit line is formed on a semiconductor substrate 110.

An etching stop layer 112 and an insulating layer 130 are successively formed on the lower conductive layer 120. The insulating layer 130 may include silicon oxide, silicon nitride, silicon doped with impurities, or mixtures thereof.

A first mask layer 140 and a second mask layer 150 are successively formed on the insulating layer 130. The first mask layer 140 functions to broaden an inlet of the via hole or the contact hole in which a metal plug is formed. Accordingly, the first mask layer 140 may include material having an etching selectivity relative to the insulating layer 130. The first mask layer 140 may include fluorine-doped oxide, carbon-doped oxide, silicon-based oxide, hydrogen silsesquioxane (HSQ), flowable oxide, or a methylsilsesquioxane based material (LKD). The first mask layer 140 has a thickness of, for example, about 150 nm to about 300 nm.

The second mask layer 150 functions as forming an insulating pattern. The second mask layer 150 may include SiON, SiC-based material, Si-based material, Si-based nitride material, or a mixture thereof.

A photoresist layer (not shown) is formed on the second mask layer 150. The photoresist layer is exposed and developed to form a photoresist pattern 160. A first width W1 of portion of the second mask layer exposed through the photoresist pattern 160 is substantially identical to a diameter of the via hole or the contact hole.

Figure 5B:
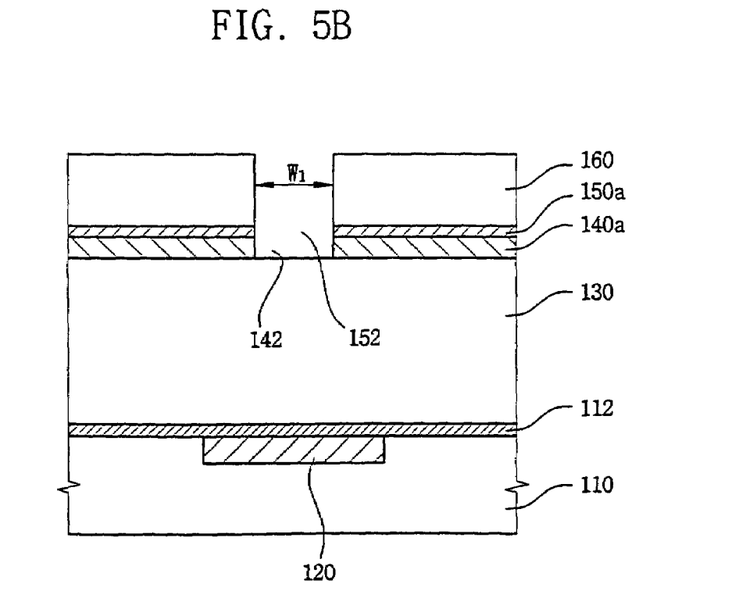

Referring to FIG. 5B, the first and second mask layers 140 and 150 are dry etched using the photoresist pattern 160 as a mask to form first and second masks 140a and 150a. The first mask 140a has a first opening 142 having the first width W1, and the second mask 150a has a second opening 152 having the first width W1.

Figure 5C:
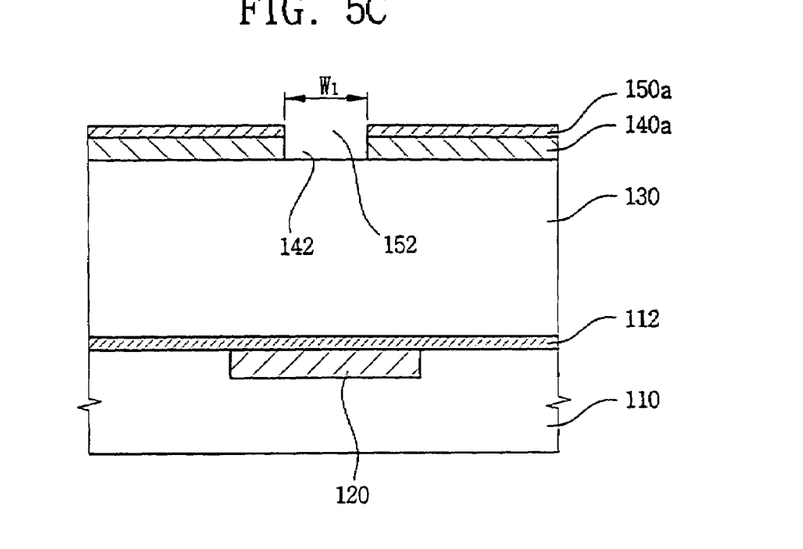

Referring to FIG. 5C, the photoresist pattern 160 is removed by an ashing process, a rinsing process using $H_2SO_4$ or $H_2O_2$, or an organic stripper.

Figure 5D:
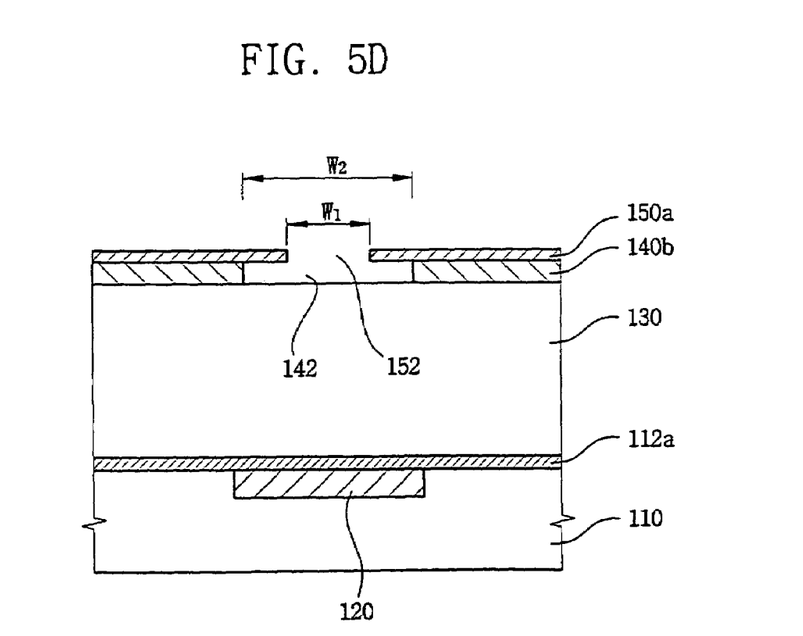

Referring to FIG. 5D, the resultant structure is etched by a wet etching process using an etching solution including HF to form a third mask 140b. The etching solution may include a solution containing fluorine, a solution containing ammonia, a solution containing hydrogen fluoride, or an alkaline solution containing ammonia. Since the first mask 140a has a higher etching selectivity than the second mask 150a with respect to the HF solution, the HF solution etches the first mask 140a in a direction toward a side of the first opening 142 to form the third mask 140b having a second opening 142a that has a second width W2 longer than the first width W1.

Figure 5E:
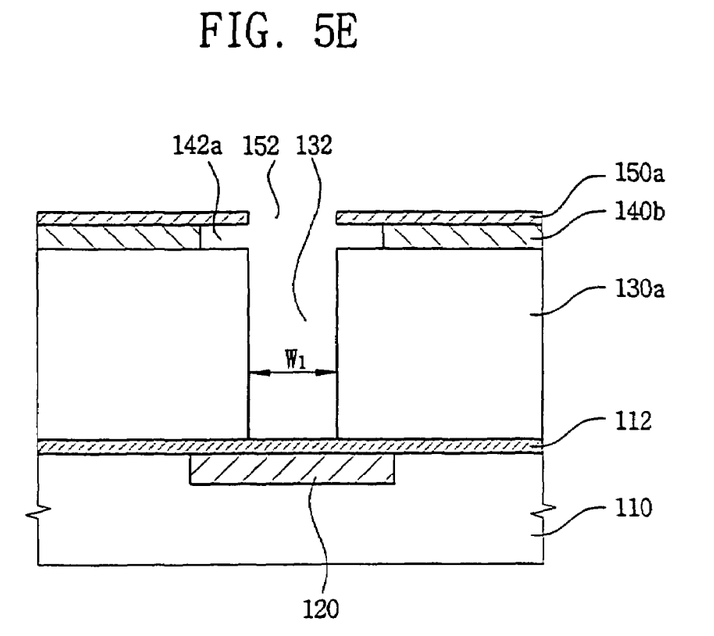

Referring to FIG. 5E, the insulating layer 130 is dry etched using the second mask 150a as a mask for exposing an upper surface of the etching stop to form an insulating layer pattern 130a having a via hole 132. The via hole 132 has the first width W1 substantially identical to the that of the first opening 142.

Figure 5F:
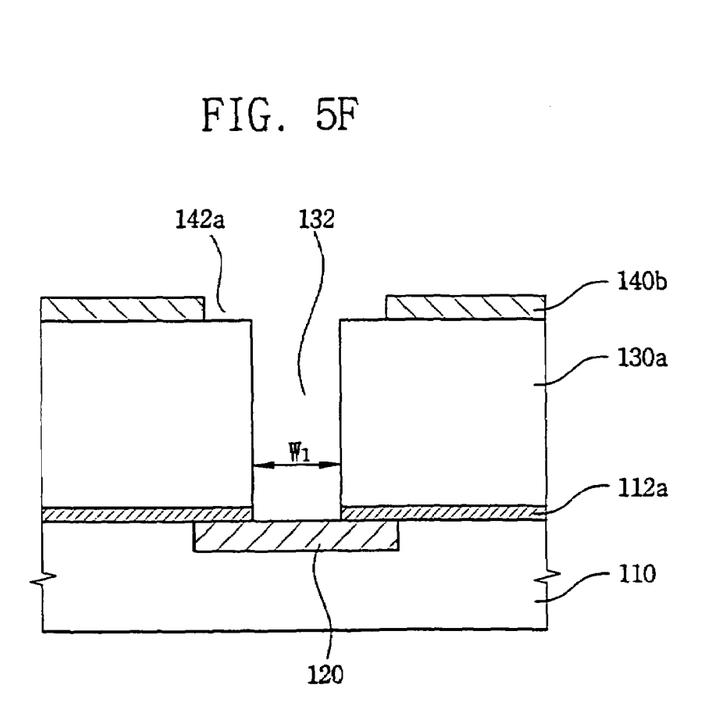

Referring to FIG. 5F, the second mask 150a is removed. The portion of the etching stop layer 112 exposed through the first opening 142 is simultaneously removed to form etching stop layer pattern 112a having an opening that has the first width W1. The via hole 132 has a diameter substantially identical to the first width W1 of the first opening 142. The inlet of the via hole 142 is broadened by the first opening 142a. In one embodiment, the via hole has a diameter of, for example, about 100 nm to about 250 nm.

Figure 5G:
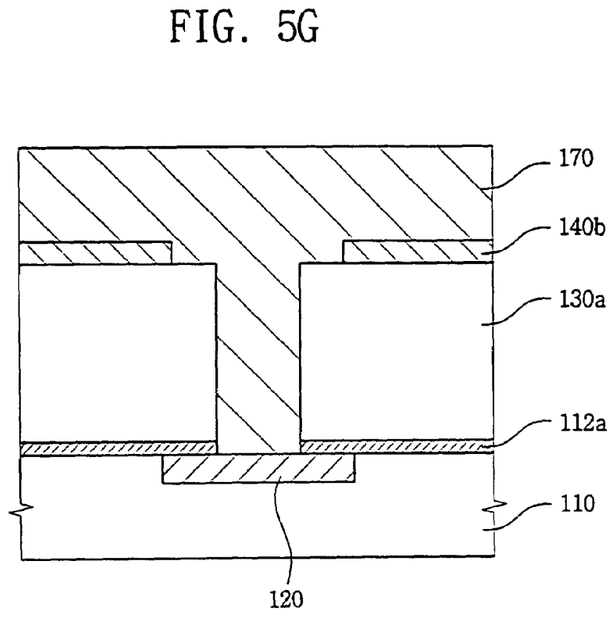

Referring to FIGS. 5G and 6, an electroplating process is performed on the insulating layer pattern 130a and the third mask 140b using an electrolyte solution including copper to form a copper layer 170. The electrolyte solution may include an additive, for example, such as an accelerator and a suppressor, for improving the gap filling characteristic and uniformity of the copper layer 170. The electrolyte solution includes, for example, about 10 g/liter to about 30 g/liter of copper, about 100 g/liter to about 300 g/liter of $H_2SO_4$, about 40 ppm to about 120 ppm of chlorine, about 15 ml/liter to about 45 ml/liter of the accelerator, and about 1 ml/liter to about 4 ml/liter of the suppressor.

The suppressor reduces the deposition speed of copper on wide patterns. The accelerator increases the deposition speed of copper on minute patterns. Accordingly, the accelerator accelerates the growth of the copper layer 170 on a bottom of the via hole 132 (see X in FIG. 6). The suppressor decelerates the growth of the copper layer 170 on the inlet of the via hole 132 (see Y in FIG. 6). Also, the copper layer 170 slowly grows on the first mask layer pattern 150a by the suppressor (see Z in FIG. 6). As a result, the copper layer 170 grows on a localized dual damascene region having a shallow trench isolation (STI) shape.

Figure 5H:
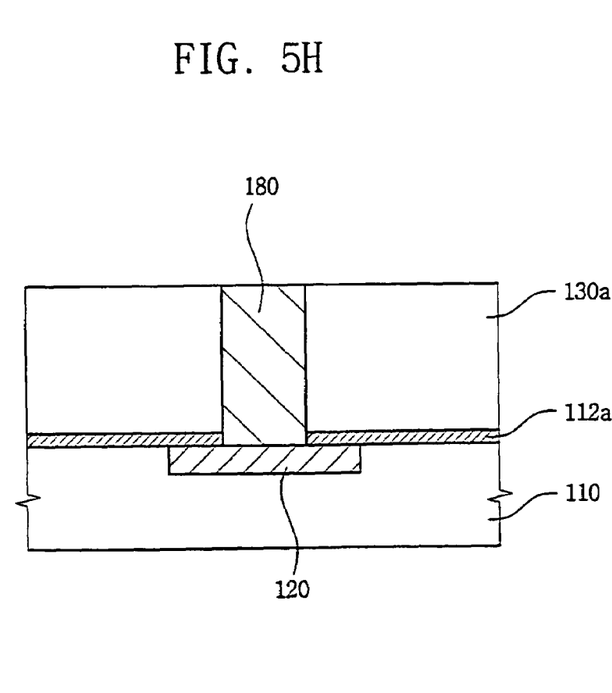

Referring to FIG. 5H, the first mask 140b and the copper layer 170 are removed by a CMP process or an etch-back process for exposing the upper surface of the insulating layer pattern 130a to form a metal plug 180 disposed in the via hole 132 without recesses or voids.

FIGS. 7A to 7E are cross-sectional views illustrating a method for filling a hole with a metal according to some other embodiments of the invention.

Figure 7A:
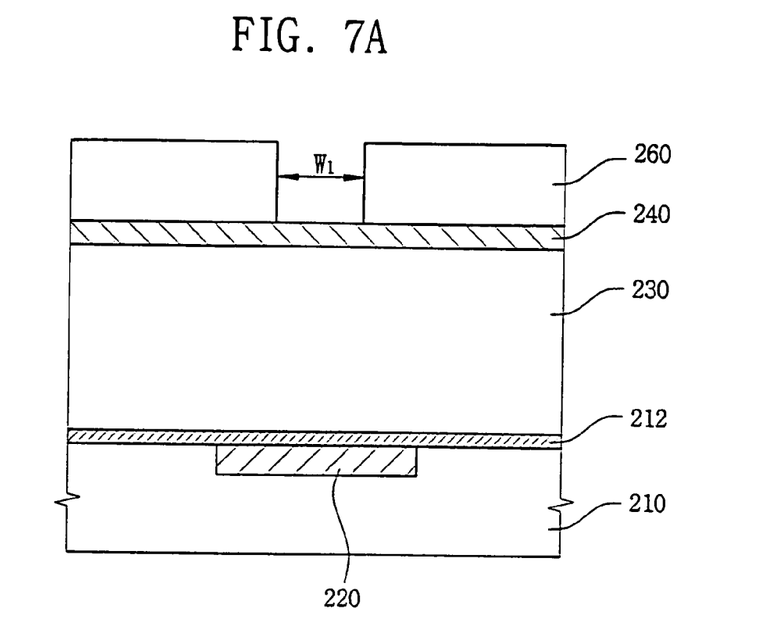
FIGS. 7A to 7E are cross-sectional views illustrating a method for filling a hole with a metal according to still other embodiments of the invention.

Referring to FIG. 7A, a lower conductive layer 220 corresponding to source/drain regions, a word line, or a bit line is formed on a semiconductor substrate 210. An etching stop layer 212 and an insulating layer 230 are successively formed on the lower conductive layer 220. The insulating layer 230 may include silicon oxide, silicon nitride, silicon doped with impurities, or a mixture thereof.

A mask layer 240 is formed on the insulating layer 230. The mask layer 240 broadens an inlet of the via hole or the contact hole in which a metal plug is formed. Accordingly, the mask layer 240 may include a material having an etching selectivity different from the insulating layer 230. The mask layer 240 may include fluorine-doped oxide, carbon-doped oxide, silicon-based oxide, hydrogen silsesquioxane (HSQ), flowable oxide, or methylsilsesquioxane based material (LKD). The mask layer 240 has thickness of, for example, about 150 nm to about 300 nm.

A photoresist layer (not shown) is formed on the mask layer 240 by a spin coating process. The photoresist layer is exposed and developed to form a first photoresist pattern 260. A first width W1 of portion of the mask layer 240 exposed through the first photoresist pattern 260 is substantially identical to a diameter of the via hole or the contact hole.

Figure 7B:
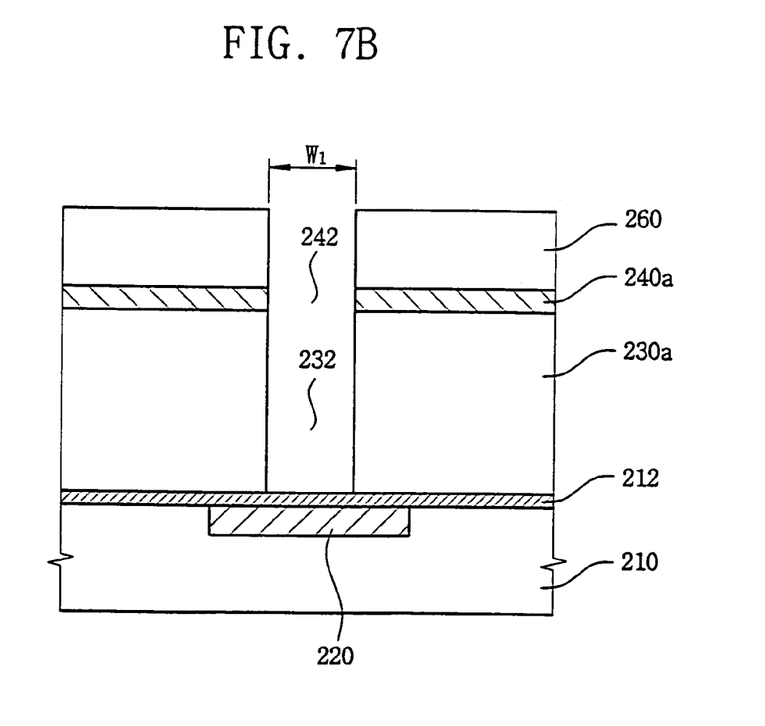

Referring to FIG. 7B, the insulating layer 230 and the mask layer 240 are etched by a dry etching process using the first photoresist pattern 260 as a mask to form an insulating layer pattern 230a and a first mask 240a. The insulating layer pattern 230a has a hole 232 having the first width W1, and the first mask 240a has a first opening 242 having the first width W1.

Figure 7C:
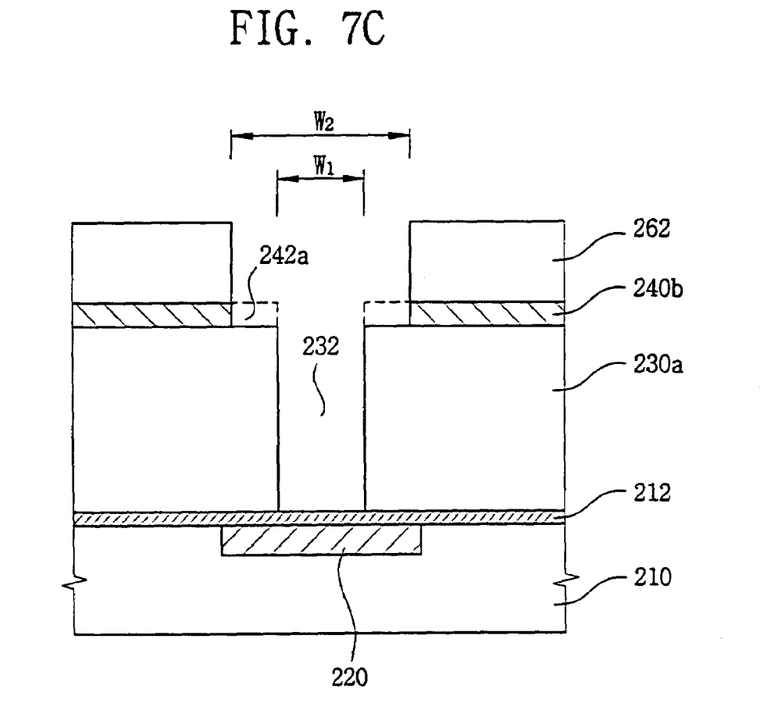

Referring to FIG. 7C, the first photoresist pattern 260 is removed by an ashing process or a stripping process. A second photoresist pattern 262 having an opening that has a width longer than first width W1 is formed on the first mask 240a. The first mask 240a is etched by dry etching process using the second photoresist pattern 262 as a mask for exposing an upper surface of the insulating layer pattern 230a to form a second mask 240b. The second mask 240b has a second opening 242a that has a second width W2 longer than the first width W1.

Figure 7D:
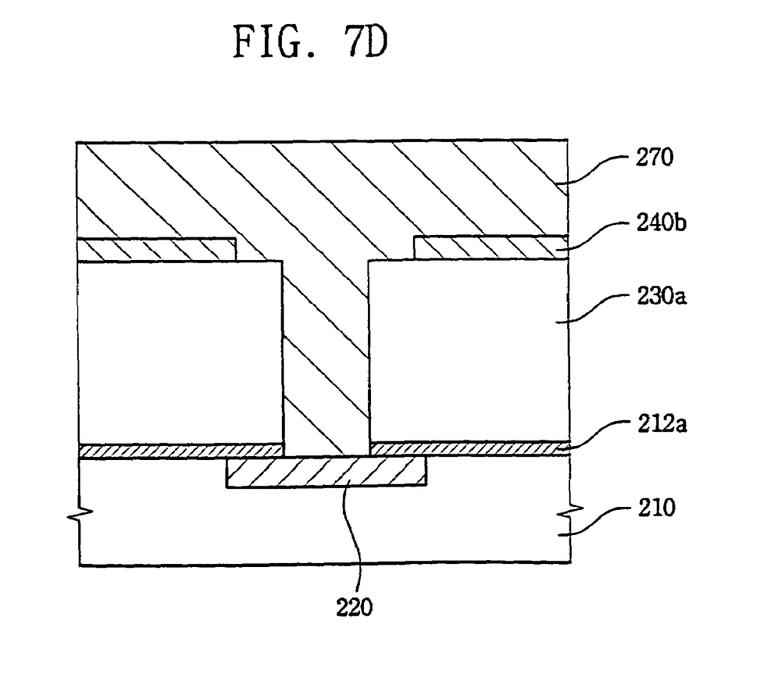

Referring to FIG. 7D, the second photoresist pattern 262 is removed by an ashing process or a stripping process. The portion of the etching stop layer 212 exposed through the via hole 232 is removed to form an etching stop layer pattern 212a. The via hole 232 has the first width W1 of about 100 nm to about 250 nm. The inlet of the via hole 232 is broadened by the second opening 232a.

An electroplating process is performed on the insulating layer pattern 230a and the second mask 240b using an electrolyte solution including copper to form a copper layer 270. The electrolyte solution may include an additive, for example, such as an accelerator and a suppressor, for improving the gap filling characteristic and uniformity of the copper layer 270. The electrolyte solution includes, for example, about 10 g/liter to about 30 g/liter of copper, about 100 g/liter to about 300 g/liter of $H_2SO_4$, about 40 ppm to about 120 ppm of chlorine, about 15 ml/liter to about 45 ml/liter of the accelerator, and about 1 ml/liter to about 4 ml/liter of the suppressor.

The suppressor reduces the deposition rate of copper on wide patterns. The accelerator increases the deposition speed of copper on minute patterns. Accordingly, the accelerator accelerates the growth of the copper layer 270 on a bottom of the via hole 232. The suppressor decelerates the growth of the copper layer 270 on the inlet of the via hole 232.

Figure 7E:
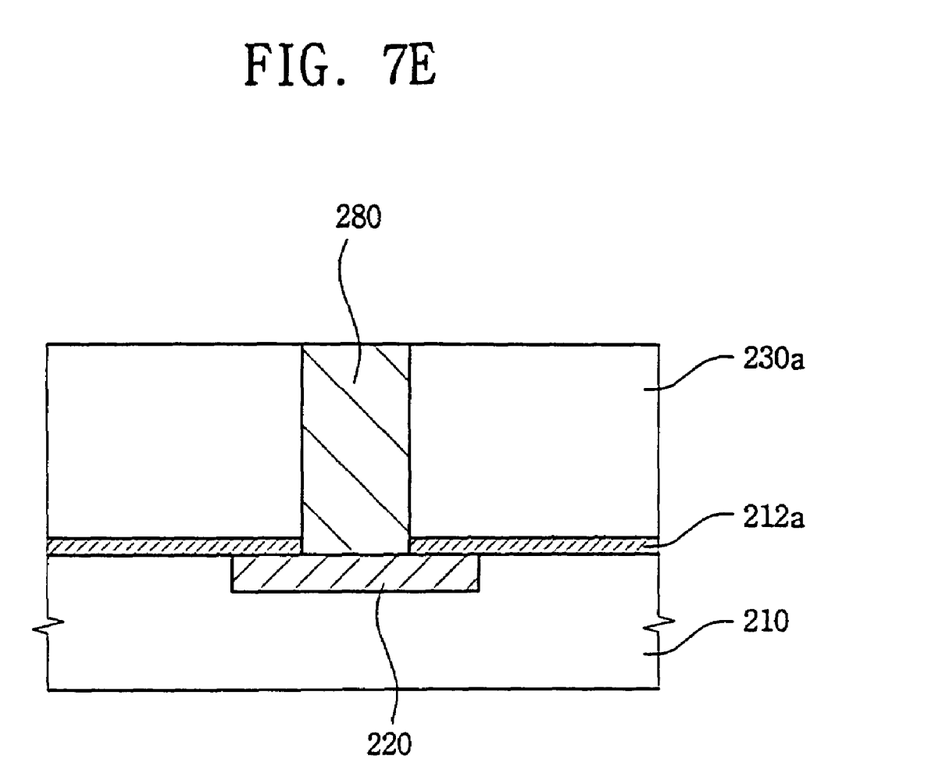

Referring to FIG. 7E, the first mask 240b and the copper layer 270 are removed by a CMP process or an etch-back process for exposing the upper surface of the insulating layer pattern 230a to form a metal plug 280 disposed in the via hole 232 without recesses or voids.

According to embodiments of the invention, the metal plug without the recesses or the voids may be formed in the via hole or the contact hole so that the gap filling characteristic of the metal plug may be improved.

Embodiments of the invention may be practiced in many ways. What follows are exemplary, non-limiting descriptions of some embodiments of the invention.

Having described several exemplary embodiments for forming semiconductor structures, it is noted that modifications and variations can be made by persons skilled in the art in light of the above teachings. It is therefore to be understood that changes and modifications may be made to the exemplary embodiments of the invention disclosed above yet nevertheless still fall within the scope and the spirit of the invention as outlined by the appended claims.

We claim:

1. A method for filling a hole with a metal comprising:
   successively forming an insulating layer, a first mask layer, and a second mask layer on a semiconductor substrate;
   etching the first and the second mask layers to respectively form first and second masks, each of the first and second masks having a first opening that has a first width;
   selectively etching the first mask to form a third mask having a second opening that has a second width that is greater than the first width;
   etching the insulating layer using the second mask to form a hole having the first width thereby exposing a conductive material at a bottom of the hole;
   forming a metal layer on the insulating layer to fill the hole and the second opening with the metal layer; and
   removing the third mask and the metal layer to expose an upper surface of the insulating layer.

2. The method of claim 1, wherein forming the third mask includes etching the first mask using an etchant, the first mask having a higher etching selectivity than the second mask with respect to the etchant.

3. The method of claim 1, wherein forming the first mask layer comprises forming the first mask layer to a thickness of about 150 nm to about 250 nm.

4. The method of claim 1, wherein forming the first mask layer comprises forming a layer selected from the group consisting of a fluorine-doped oxide layer, a carbon-doped oxide layer, a silicon-based oxide layer, a hydrogen silsesquioxane (HSQ) layer, a flowable oxide layer, a methylsilsesquioxane based material (LKD) layer, and wherein forming the second mask layer comprises forming a layer selected from the group consisting of a SiON layer, a SiC-based material layer, a Si-based material layer, and a Si-based nitride material layer.

5. The method of claim 1, farther comprising removing the second mask forming the metal prior to layer.

6. The method of claim 1, wherein forming the metal layer comprises forming the metal layer by an electroplating process.

7. The method of claim 1, wherein removing the third mask layer and the metal layer comprises using a process chosen from the group consisting of a chemical mechanical polishing (CMP) process and an etch-back process.

8. The method of claim 1, wherein the metal layer is electrically coupled to a source or drain region, a word line, or a bit line.

9. A method for filling a hole with a metal comprising:
   successively forming an insulating layer and a first mask layer on a semiconductor substrate;
   etching the first mask layer to form a first mask having a first opening that has a first width;
   etching the insulating layer using the first mask to form a hole having the first width;
   etching the first mask to form a second mask having a second opening that has a second width that is greater than the first width;
   forming a metal layer on the insulating layer to fill the hole and the second opening; and
   removing the second mask and the metal layer to expose an upper surface of the insulating layer.

10. The method of claim 9, wherein forming the first mask layer comprises forming the first mask layer to a thickness of about 150 nm to about 250 nm.

11. The method of claim 9, wherein forming the first mask layer comprises forming a layer chosen from the group consisting of a fluorine-doped oxide layer, a carbon-doped oxide layer, a silicon-based oxide layer, a hydrogen silsesquioxane (HSQ) layer, a flowable oxide layer, and a methylsilsesquioxane based material (LKD) layer, and forming the second mask layer comprises forming a layer chosen from the group consisting of a SiON layer, a SiC-based material layer, a Si-based material layer, and a Si-based nitride material layer.

12. The method of claim 9, wherein forming the metal layer comprises forming the metal layer by an electroplating process.

13. The method of claim 9, wherein removing the second mask and the metal layer comprises using a process chosen from the group consisting of a chemical mechanical polishing (CMP) process and an etch-back process.

14. The method of claim 9, wherein a bottom portion of the metal layer is physically coupled to a source or drain region, a word line, or a bit line.

15. A method for filling a hole with a metal comprising:
   forming an insulating layer on a semiconductor substrate;
   successively forming first and second mask layers on the insulating layer;
   forming a photoresist pattern on the second mask layer;
   etching the first and second mask layers using the photoresist pattern as a mask to form a first mask having a first opening that has a first width and a second mask having a second opening that has the first width;

etching the first mask using an etchant, the first mask having a higher etching selectivity with respect to the etchant than the second mask, to form a third mask having a third opening that has a second width that is greater than the first width;

etching the insulating layer using the second mask to form a hole having the first width;

forming a metal layer on the insulating layer to fill the hole and the third opening; and removing the third mask and the metal layer to expose an upper surface of the insulating layer.

16. The method of claim 15, wherein forming the first mask layer forming a layer selected from the group consisting of a fluorine-doped oxide layer, a carbon-doped oxide layer, a silicon-based oxide layer, a hydrogen silsesquioxane (HSQ) layer, a flowable oxide layer, and a methylsilsesquioxane based material (LKD) layer, and forming the second mask layer comprises forming a layer selected from the group consisting of a SiON layer, a SiC-based material layer, a Si-based material layer, and a Si-based nitride material layer.

17. The method of claim 15, wherein the etchant comprises a solution selected from the group consisting of a fluorine solution, an ammonia solution, a hydrogen fluoride solution, and an alkaline ammonia solution.

18. The method of claim 15, wherein forming the metal layer comprises forming a copper layer with an electroplating process.

19. The method of claim 18, wherein forming the copper layer with the electroplating process comprises electroplating with an electrolyte solution that includes about 10 g/liter to about 30 g/liter of copper, about 100 g/liter to about 300 g/liter of H2SO4, about 40 ppm to about 120 ppm of chlorine, about 15 ml/liter to about 45 ml/liter of an accelerator, and about 1 ml/liter to about 4 ml/liter of a suppressor.

20. The method of claim 15, wherein removing the third mask and the metal layer comprises using a process selected from the group consisting of a chemical mechanical polishing (CMP) process and an etch-back process.

21. The method of claim 15, further comprising removing the second mask prior to forming the metal layer.

22. A method for filling a hole with a metal comprising:

successively forming an insulating layer and a mask layer on a semiconductor substrate;

forming a first photoresist pattern on the mask layer;

etching the insulating layer and the mask layer using the first photoresist pattern as a mask to simultaneously form an insulating layer pattern having a hole that has a first width and a first mask having a first opening that has the first width;

forming a second photoresist pattern having a pattern width greater than the first width on the first mask;

etching the first mask using the second photoresist pattern as a mask for exposing an upper surface of the insulating layer pattern to form a second mask having a second opening that has a second width greater than the first width;

forming a metal layer on the insulating layer to fill the hole and the second opening; and removing the second mask and the metal layer to expose an upper surface of the insulating layer.

* * * * *